United States Patent
Cao et al.

(10) Patent No.: US 12,381,522 B2
(45) Date of Patent: *Aug. 5, 2025

(54) AVERAGE POWER TRACKING SYSTEMS WITH FAST TRANSIENT SETTLING

(71) Applicant: Skyworks Solutions, Inc., Irvine, CA (US)

(72) Inventors: Haibo Cao, Newbury Park, CA (US); David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 618 days.

This patent is subject to a terminal disclaimer.

(21) Appl. No.: 17/650,447

(22) Filed: Feb. 9, 2022

(65) Prior Publication Data

US 2022/0294486 A1  Sep. 15, 2022

Related U.S. Application Data

(60) Provisional application No. 63/200,468, filed on Mar. 9, 2021.

(51) Int. Cl.
 *H03F 3/24* (2006.01)
 *H03F 1/02* (2006.01)
 (Continued)

(52) U.S. Cl.
 CPC .......... *H03F 3/245* (2013.01); *H03F 1/0227* (2013.01); *H03F 1/0238* (2013.01); *H03F 3/195* (2013.01);
 (Continued)

(58) Field of Classification Search
 CPC ...... H03F 3/245; H03F 1/0227; H03F 1/0238; H03F 3/195; H03F 2200/105;
 (Continued)

(56) References Cited

U.S. PATENT DOCUMENTS

| | | | |
|---|---|---|---|
| 8,165,642 B2 * | 4/2012 | Dimpflmaier | H03F 3/24 455/572 |
| 8,786,371 B2 * | 7/2014 | Popplewell | H02M 3/158 330/297 |

(Continued)

FOREIGN PATENT DOCUMENTS

KR    20160028943 A   *   4/2015

OTHER PUBLICATIONS

W. Gao, "Average Power Tracking Power Amplifier with Multilevel Supply Voltage for Wi-Fi Applications," ICC 2020—2020 IEEE International Conference on Communications (ICC), Dublin, Ireland, 2020, pp. 1-6. (Year: 2020).*

*Primary Examiner* — Yuwen Pan
*Assistant Examiner* — Swati Jain
(74) *Attorney, Agent, or Firm* — Knobbe, Martens, Olson & Bear, LLP

(57) ABSTRACT

Average power tracking (APT) systems with fast transient settling are disclosed. In certain embodiments, an APT system is used to provide a power amplifier supply voltage to a power amplifier that amplifies a radio frequency (RF) signal. The APT system controls the power amplifier supply voltage to track an average power of the RF signal, and includes a DC-to-DC converter that is assisted by an error amplifier in transitioning from one power amplifier supply voltage level to another power amplifier supply voltage level. Thus, the combination of a DC-to-DC converter with a fast changing error amplifier can swing enough AC voltage with a low enough slew rate to be able to rapidly transition the power amplifier supply voltage from one APT voltage level to another APT voltage level.

20 Claims, 17 Drawing Sheets

(51) Int. Cl.
*H03F 3/195* (2006.01)
*H04B 1/04* (2006.01)
*H04B 1/40* (2015.01)

(52) U.S. Cl.
CPC ............... *H04B 1/04* (2013.01); *H04B 1/40* (2013.01); *H03F 2200/105* (2013.01); *H03F 2200/451* (2013.01); *H04B 2001/0408* (2013.01); *H04B 2001/045* (2013.01)

(58) Field of Classification Search
CPC .. H03F 2200/451; H03F 1/025; H03F 1/0255; H03F 1/0266; H03F 1/0272; H04B 1/04; H04B 1/40; H04B 2001/0408; H04B 2001/045
See application file for complete search history.

(56) References Cited

U.S. PATENT DOCUMENTS

| | | | |
|---|---|---|---|
| 8,818,305 B1* | 8/2014 | Schwent | H03F 1/0227 455/574 |
| 10,425,002 B2* | 9/2019 | Yao | H03F 3/45 |
| 2013/0043944 A1 | 2/2013 | Jones | |
| 2013/0147445 A1 | 6/2013 | Levesque et al. | |
| 2013/0177106 A1 | 7/2013 | Levesque et al. | |
| 2013/0207731 A1* | 8/2013 | Balteanu | H03F 3/211 330/296 |
| 2013/0210411 A1 | 8/2013 | Ojha et al. | |
| 2013/0217341 A1 | 8/2013 | Jones et al. | |
| 2014/0043098 A1 | 2/2014 | Rozenblit | |
| 2014/0111178 A1 | 4/2014 | Khlat et al. | |
| 2014/0139199 A1 | 5/2014 | Khlat et al. | |
| 2014/0155127 A1 | 6/2014 | Dakshinamurthy et al. | |
| 2014/0184334 A1 | 7/2014 | Nobbe et al. | |
| 2014/0184335 A1 | 7/2014 | Nobbe et al. | |
| 2014/0184336 A1 | 7/2014 | Nobbe et al. | |
| 2014/0184337 A1 | 7/2014 | Nobbe et al. | |
| 2014/0210433 A1 | 7/2014 | Rutkowski et al. | |
| 2014/0210550 A1 | 7/2014 | Mathe et al. | |
| 2014/0306769 A1 | 10/2014 | Khlat et al. | |
| 2014/0341318 A1* | 11/2014 | Pourkhaatoun | H04W 52/0258 375/297 |
| 2014/0361837 A1 | 12/2014 | Strange et al. | |
| 2015/0048891 A1 | 2/2015 | Rozek et al. | |
| 2015/0091653 A1 | 4/2015 | Kobayashi et al. | |
| 2015/0194936 A1 | 7/2015 | Inanoglu et al. | |
| 2015/0194988 A1 | 7/2015 | Yan et al. | |
| 2015/0195118 A1 | 7/2015 | Yan et al. | |
| 2015/0236652 A1* | 8/2015 | Yang | H03F 1/0227 330/251 |
| 2015/0236729 A1 | 8/2015 | Peng et al. | |
| 2015/0236877 A1 | 8/2015 | Peng et al. | |
| 2015/0270806 A1 | 9/2015 | Wagh et al. | |
| 2015/0280674 A1 | 10/2015 | Langer et al. | |
| 2015/0280675 A1 | 10/2015 | Langer et al. | |
| 2015/0381215 A1 | 12/2015 | Butterfield et al. | |
| 2015/0381401 A1 | 12/2015 | Butterfield et al. | |
| 2016/0036388 A1 | 2/2016 | Xu et al. | |
| 2016/0065137 A1 | 3/2016 | Khlat | |
| 2016/0088679 A1 | 3/2016 | Khlat et al. | |
| 2016/0094214 A1* | 3/2016 | Liu | H03K 17/005 327/113 |
| 2016/0164468 A1 | 6/2016 | Nobbe et al. | |
| 2016/0164469 A1 | 6/2016 | Nobbe et al. | |
| 2016/0190989 A1 | 6/2016 | Nobbe et al. | |
| 2016/0190993 A1 | 6/2016 | Nobbe et al. | |
| 2016/0191001 A1 | 6/2016 | Ripley et al. | |
| 2016/0191002 A1 | 6/2016 | Ripley et al. | |
| 2016/0191086 A1 | 6/2016 | Ripley et al. | |
| 2016/0241199 A1 | 8/2016 | Nobbe et al. | |
| 2016/0241208 A1* | 8/2016 | Lehtola | H03F 1/0266 |
| 2016/0254746 A1 | 9/2016 | Lerdworatawee | |
| 2017/0012588 A1 | 1/2017 | Levesque | |
| 2017/0019071 A1 | 1/2017 | Kobayashi et al. | |
| 2017/0019072 A1 | 1/2017 | Kobayashi et al. | |
| 2017/0026005 A1 | 1/2017 | Ripley et al. | |
| 2017/0040948 A1 | 2/2017 | Levesque | |
| 2017/0052553 A1 | 2/2017 | Gebeyehu et al. | |
| 2017/0093339 A1 | 3/2017 | Wu et al. | |
| 2017/0133989 A1 | 5/2017 | Dykstra et al. | |
| 2017/0141875 A1 | 5/2017 | Eliaz et al. | |
| 2017/0146591 A1 | 5/2017 | Nobbe et al. | |
| 2017/0179887 A1 | 6/2017 | Henzler et al. | |
| 2017/0179888 A1 | 6/2017 | Nag et al. | |
| 2017/0302231 A1 | 10/2017 | Ripley et al. | |
| 2017/0359029 A1 | 12/2017 | Nobbe et al. | |
| 2018/0048272 A1* | 2/2018 | Lin | H02M 3/158 |
| 2018/0083578 A1 | 3/2018 | Klaren et al. | |
| 2018/0120881 A1 | 5/2018 | Gebeyehu et al. | |
| 2018/0123516 A1* | 5/2018 | Kim | H03F 1/02 |
| 2018/0123518 A1 | 5/2018 | Wu et al. | |
| 2018/0164366 A1 | 6/2018 | Nobbe et al. | |
| 2018/0262994 A1 | 9/2018 | Park et al. | |
| 2018/0278213 A1 | 9/2018 | Henzler et al. | |
| 2018/0288697 A1 | 10/2018 | Camuffo et al. | |
| 2018/0294781 A1* | 10/2018 | Rogers | H03F 1/0277 |
| 2018/0302047 A1 | 10/2018 | Igarashi et al. | |
| 2018/0316320 A1 | 11/2018 | Soubercaze-Pun et al. | |
| 2018/0375475 A1 | 12/2018 | Nag et al. | |
| 2019/0081649 A1 | 3/2019 | Khlat et al. | |
| 2019/0113564 A1 | 4/2019 | Nobbe et al. | |
| 2019/0158031 A1 | 5/2019 | Klaren et al. | |
| 2019/0179352 A1* | 6/2019 | Sakurai | G05F 1/575 |
| 2019/0214946 A1 | 7/2019 | Wu et al. | |
| 2019/0243403 A1* | 8/2019 | Gebeyehu | H03F 1/0227 |
| 2019/0245489 A1 | 8/2019 | Sutskover et al. | |
| 2019/0302817 A1 | 10/2019 | Rosolowski et al. | |
| 2019/0334480 A1 | 10/2019 | Nomiyama et al. | |
| 2019/0334750 A1 | 10/2019 | Nomiyama et al. | |
| 2019/0363676 A1 | 11/2019 | Megretski et al. | |
| 2019/0386565 A1 | 12/2019 | Rosolowski et al. | |
| 2019/0386617 A1 | 12/2019 | Naraine et al. | |
| 2020/0007088 A1 | 1/2020 | Ranta et al. | |
| 2020/0014335 A1 | 1/2020 | Henzler et al. | |
| 2020/0028471 A1 | 1/2020 | Khlat | |
| 2020/0044610 A1 | 2/2020 | Henzler et al. | |
| 2020/0052654 A1 | 2/2020 | McGowan et al. | |
| 2020/0099341 A1 | 3/2020 | Duncan et al. | |
| 2020/0119705 A1 | 4/2020 | Camuffo et al. | |
| 2020/0162032 A1 | 5/2020 | Ripley et al. | |
| 2020/0204422 A1 | 6/2020 | Khlat | |
| 2020/0287577 A1 | 9/2020 | Hitomi et al. | |
| 2020/0295790 A1 | 9/2020 | Langer et al. | |
| 2020/0321917 A1 | 10/2020 | Nomiyama et al. | |
| 2020/0336111 A1 | 10/2020 | Khlat | |
| 2020/0343861 A1 | 10/2020 | Takenaka | |
| 2020/0382147 A1 | 12/2020 | Menkhoff et al. | |
| 2020/0389132 A1 | 12/2020 | Khlat et al. | |
| 2020/0395895 A1 | 12/2020 | Sano et al. | |
| 2020/0412307 A1 | 12/2020 | Hitomi et al. | |
| 2021/0013841 A1 | 1/2021 | Klaren et al. | |
| 2021/0048474 A1 | 2/2021 | Nobbe et al. | |
| 2021/0050819 A1 | 2/2021 | Wang | |
| 2021/0050828 A1 | 2/2021 | Paul et al. | |
| 2021/0058036 A1 | 2/2021 | Sutskover et al. | |
| 2021/0091732 A1 | 3/2021 | Camuffo et al. | |
| 2021/0104979 A1 | 4/2021 | Ng et al. | |
| 2021/0104985 A1 | 4/2021 | Ng et al. | |
| 2021/0105607 A1 | 4/2021 | Ioffe et al. | |
| 2021/0136629 A1 | 5/2021 | Ioffe et al. | |
| 2021/0152201 A1 | 5/2021 | Megretski et al. | |
| 2021/0194517 A1 | 6/2021 | Mirea et al. | |
| 2021/0203280 A1 | 7/2021 | Naraine et al. | |
| 2021/0218370 A1 | 7/2021 | Balteanu et al. | |
| 2021/0234564 A1 | 7/2021 | Langer et al. | |
| 2021/0265953 A1 | 8/2021 | Khlat | |
| 2021/0288615 A1 | 9/2021 | Khlat | |
| 2021/0314870 A1 | 10/2021 | Hoversten et al. | |
| 2021/0385752 A1 | 12/2021 | Hoversten et al. | |
| 2021/0389789 A1* | 12/2021 | Khlat | G05F 1/575 |
| 2021/0408906 A1 | 12/2021 | Rosolowski et al. | |
| 2022/0014155 A1 | 1/2022 | Ripley et al. | |
| 2022/0021348 A1 | 1/2022 | Philpott et al. | |

(56) References Cited

U.S. PATENT DOCUMENTS

| | | |
|---|---|---|
| 2022/0030525 A1 | 1/2022 | Chincholi et al. |
| 2022/0069787 A1 | 3/2022 | King et al. |
| 2022/0069788 A1 | 3/2022 | King et al. |
| 2022/0103140 A1 | 3/2022 | Paul et al. |
| 2022/0123653 A1 | 4/2022 | Youn et al. |
| 2022/0190793 A1* | 6/2022 | Chen ........................ H03F 3/19 |
| 2022/0294400 A1 | 9/2022 | Cao et al. |
| 2023/0275547 A1* | 8/2023 | Kim ...................... H03F 1/0227 |
| | | 330/136 |

\* cited by examiner

AVERAGE POWER TRACKING SYSTEMS WITH FAST TRANSIENT SETTLING

CROSS-REFERENCE TO RELATED APPLICATIONS

This application claims the benefit of priority under 35 U.S.C. § 119 of U.S. Provisional Patent Application No. 63/200,468, filed Mar. 9, 2021 and titled "AVERAGE POWER TRACKING SYSTEMS WITH FAST TRANSIENT SETTLING," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 425 MHz to about 7.125 GHz for Frequency Range 1 (FR1) of the Fifth Generation (5G) communication standard or in the range of about 24.250 GHz to about 52.600 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a radio frequency signal, a front-end system including a power amplifier configured to amplify the radio frequency signal and to receive power from a power amplifier supply voltage, and a power management system configured to provide the power amplifier supply voltage to the power amplifier. The power management system includes a direct current (DC)-to-DC converter and an error amplifier configured to operate in combination with one another to transition the power amplifier supply voltage from a first average power tracking voltage level to a second average power tracking voltage level.

In some embodiments, the power management system further includes a control circuit configured to control a first input of the error amplifier based on the second average power tracking voltage level. According to a number of embodiments, the power management system further includes a feedback circuit electrically connected between the power amplifier supply voltage and a second input of the error amplifier. In accordance with several embodiments, the control circuit includes a power detector configured to control the first input of the error amplifier based on sensing an output power of the power amplifier.

In various embodiments, the DC-to-DC converter receives a reference voltage indicating the second average power tracking voltage level. According to a number of embodiments, the DC-to-DC converter is configured to output a control voltage for controlling a first input of the error amplifier.

In several embodiments, the mobile device further includes a battery configured to provide a battery voltage to the DC-to-DC converter. According to a number of embodiments, the power management system further includes a boost regulator configured to generate a boosted supply voltage for the error amplifier from the battery voltage.

In some embodiments, the method further includes an antenna configured to transmit an amplified radio frequency signal provided from the power amplifier.

In certain embodiments, the present disclosure relates to a method of average power tracking in a mobile device. The method includes amplifying a radio frequency signal using a power amplifier, powering the power amplifier using a power amplifier supply voltage provided by a power management system, and transitioning the power amplifier supply voltage from a first average power tracking voltage level to a second average power tracking voltage level using an error amplifier and a DC-to-DC converter of the power management system.

In various embodiments, transitioning the power amplifier supply voltage further includes controlling a first input of the error amplifier based on the second average power tracking voltage level. According to a number of embodiments, transitioning the power amplifier supply voltage further includes controlling a second input of the error amplifier by providing feedback from the power amplifier supply voltage. In accordance with several embodiments, the method further includes controlling the first input of the error amplifier based on sensing an output power of the power amplifier.

In various embodiments, transitioning the power amplifier supply voltage further includes providing a reference voltage indicating the second average power tracking voltage level to the DC-to-DC converter. According to a number of embodiments, transitioning the power amplifier supply voltage further includes outputting a control voltage from the DC-to-DC converter, and controlling a first input of the error amplifier using the control voltage.

In certain embodiments, the present disclosure relates to a power amplifier system. The power amplifier system includes a power amplifier configured to amplify a radio frequency signal, the power amplifier configured to receive power from a power amplifier supply voltage, a DC-to-DC converter configured to regulate the power amplifier supply voltage, and an error amplifier configured to operate in combination with the DC-to-DC converter to transition the power amplifier supply voltage from a first average power tracking voltage level to a second average power tracking voltage level.

In various embodiments, the power amplifier system further includes a control circuit configured to control a first input of the error amplifier based on the second average power tracking voltage level. According to a number of embodiments, the power amplifier system further includes a feedback circuit electrically connected between the power amplifier supply voltage and a second input of the error amplifier. In accordance with several embodiments, the control circuit includes a power detector configured to control the first input of the error amplifier based on sensing an output power of the power amplifier.

In some embodiments, the DC-to-DC converter receives a reference voltage indicating the second average power tracking voltage level. According to a number of embodiments, the DC-to-DC converter is configured to output a control voltage for controlling a first input of the error amplifier.

In various embodiments, the power amplifier system further includes an AC coupling capacitor coupled between an output of the error amplifier and the power amplifier supply voltage.

In certain embodiments, the present disclosure relates to a mobile device. The mobile device includes a transceiver configured to generate a radio frequency signal, a front-end system including a power amplifier configured to amplify the radio frequency signal and to receive power from a power amplifier supply voltage, and a power management system configured to provide the power amplifier supply voltage to the power amplifier. The power management system is configured to generate a first regulated voltage based on a first average power tracking voltage level and a second regulated voltage based on a second average power tracking voltage level. the power management system including a DC switch configured to receive the first regulated voltage and the second regulated voltage, and operable to change state to transition the power amplifier supply voltage from the first average power tracking voltage level to the second average power tracking voltage level.

In various embodiments, the power management system further includes a first DC-to-DC converter configured to generate the first regulated voltage and a second DC-to-DC converter configured to generate the second regulated voltage. According to a number of embodiments, the mobile device further includes a battery configured to generate a common battery voltage for the first DC-to-DC converter and the second DC-to-DC converter.

In several embodiments, the power management system further includes a multi-level-supply DC-to-DC converter configured to generate the first regulated voltage and the second regulated voltage. According to a number of embodiments, the multi-level-supply DC-to-DC converter includes an inductor, a first switch connected between a battery voltage and a first end of the inductor, a second switch connected between the first end of the inductor and a ground voltage, a third switch connected between a second end of the inductor and the ground voltage, and a fourth switch connected between the second end of the inductor and the first regulated voltage. In accordance with various embodiments, the multi-level-supply DC-to-DC converter further includes a fifth switch connected between the second end of the inductor and the second regulated voltage.

In various embodiments, the first average power tracking voltage level is based on an average power of the radio frequency signal over a first time interval, and the second average power tracking voltage level is based on an average power of the radio frequency signal over a second time interval.

In a number of embodiments, the mobile device further includes an antenna configured to transmit an amplified radio frequency signal provided by the power amplifier.

In certain embodiments, the present disclosure relates to a method of average power tracking in a mobile device. The method includes amplifying a radio frequency signal using a power amplifier that is powered by a power amplifier supply voltage, generating a first regulated voltage based on a first average power tracking voltage level, generating a second regulated voltage based on a second average power tracking voltage level, providing the first regulated voltage and the second regulated voltage to a DC switch that outputs the power amplifier supply voltage, and changing a state of the DC switch to transition the power amplifier supply voltage from the first average power tracking voltage level to the second average power tracking voltage level.

In various embodiments, the method further includes setting the first average power tracking voltage level based on an average power of the radio frequency signal over a first time interval, and setting the second average power tracking voltage level based on an average power of the radio frequency signal over a second time interval.

In some embodiments, the method further includes generating the first regulated voltage using a first DC-to-DC converter, and generating the second regulated voltage using a second DC-to-DC converter. According to several embodiments, the method further includes generating a common battery voltage for the first DC-to-DC converter and the second DC-to-DC converter using a battery.

In various embodiments, the method further includes generating the first regulated voltage and the second regulated voltage using a multi-level-supply DC-to-DC converter.

In certain embodiments, the present disclosure relates to a power amplifier system. The power amplifier system includes a power amplifier configured to amplify a radio frequency signal, the power amplifier configured to receive power from a power amplifier supply voltage, and an average power tracking system configured to provide the power amplifier supply voltage to the power amplifier. The average power tracking system is configured to generate a first regulated voltage based on a first average power tracking voltage level and a second regulated voltage based on a second average power tracking voltage level. The average power tracking system includes a DC switch configured to receive the first regulated voltage and the second regulated voltage, and operable to change state to transition the power amplifier supply voltage from the first average power tracking voltage level to the second average power tracking voltage level.

In various embodiments, the average power tracking system further includes a first DC-to-DC converter configured to generate the first regulated voltage and a second DC-to-DC converter configured to generate the second regulated voltage. According to a number of embodiments, the average power tracking system further includes a battery configured to generate a common battery voltage for the first DC-to-DC converter and the second DC-to-DC converter.

In several embodiments, the power management system further includes a multi-level-supply DC-to-DC converter configured to generate the first regulated voltage and the second regulated voltage. According to a number of embodiments, the multi-level-supply DC-to-DC converter includes an inductor, a first switch connected between a battery voltage and a first end of the inductor, a second switch connected between the first end of the inductor and a ground voltage, a third switch connected between a second end of the inductor and the ground voltage, and a fourth switch connected between the second end of the inductor and the first regulated voltage. In accordance with some embodiments, the multi-level-supply DC-to-DC converter further includes a fifth switch connected between the second end of the inductor and the second regulated voltage.

In various embodiments, the first average power tracking voltage level is based on an average power of the radio frequency signal over a first time interval, and the second average power tracking voltage level is based on an average power of the radio frequency signal over a second time interval.

DETAILED DESCRIPTION OF EMBODIMENTS

Figure 1:
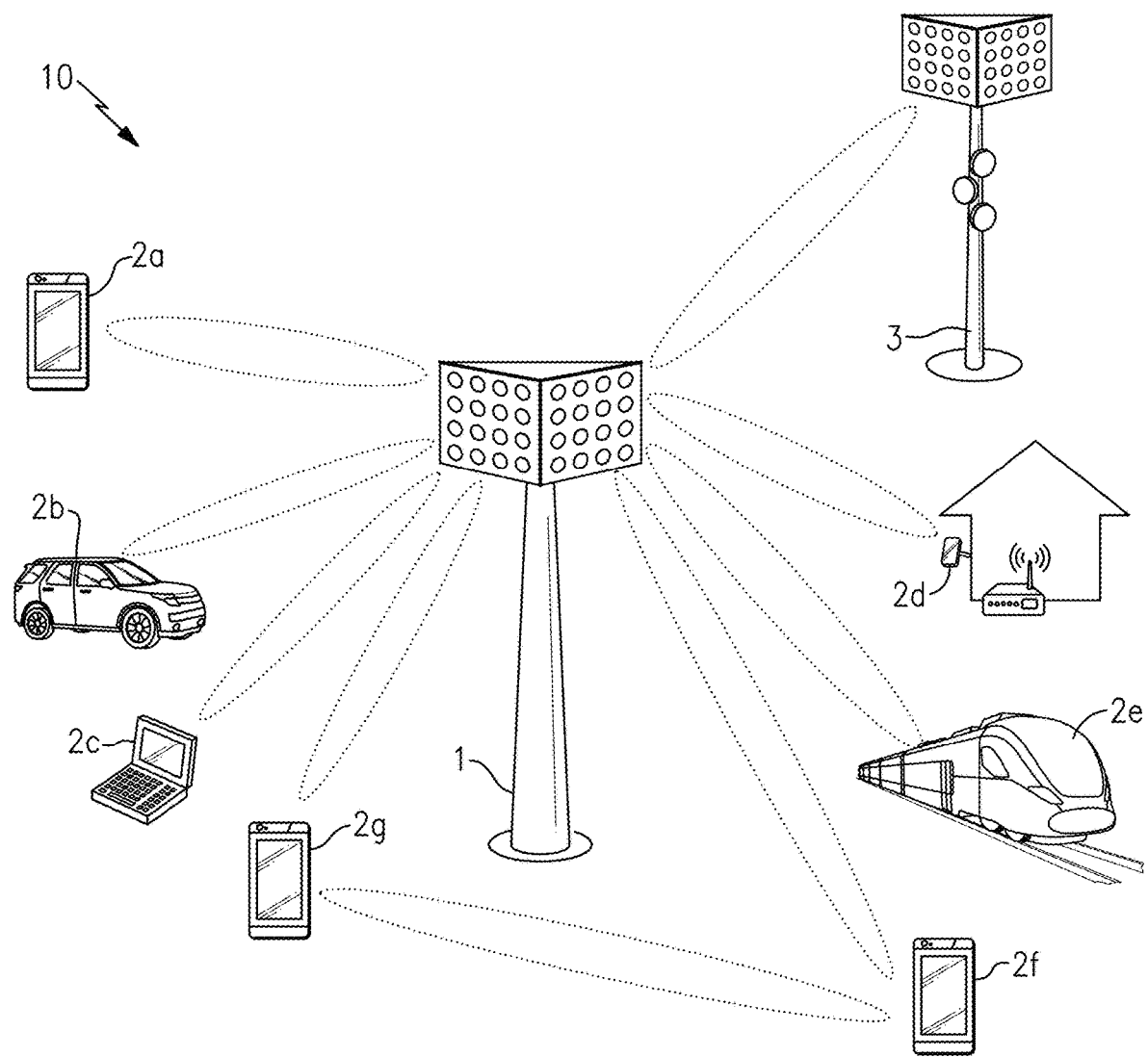
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
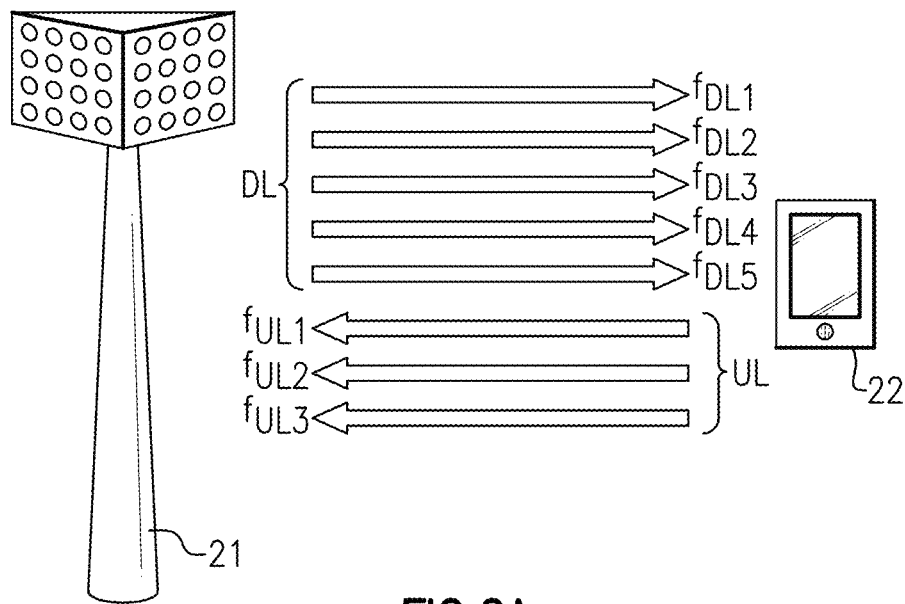
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
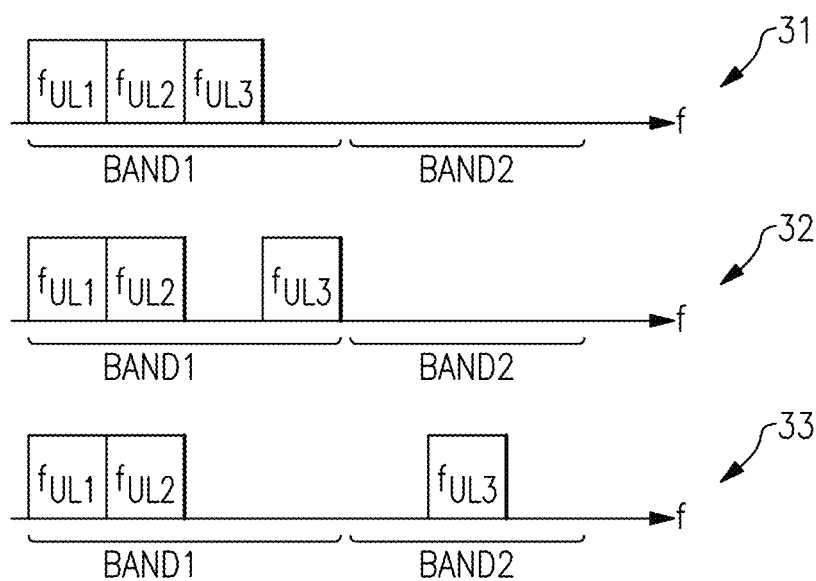
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
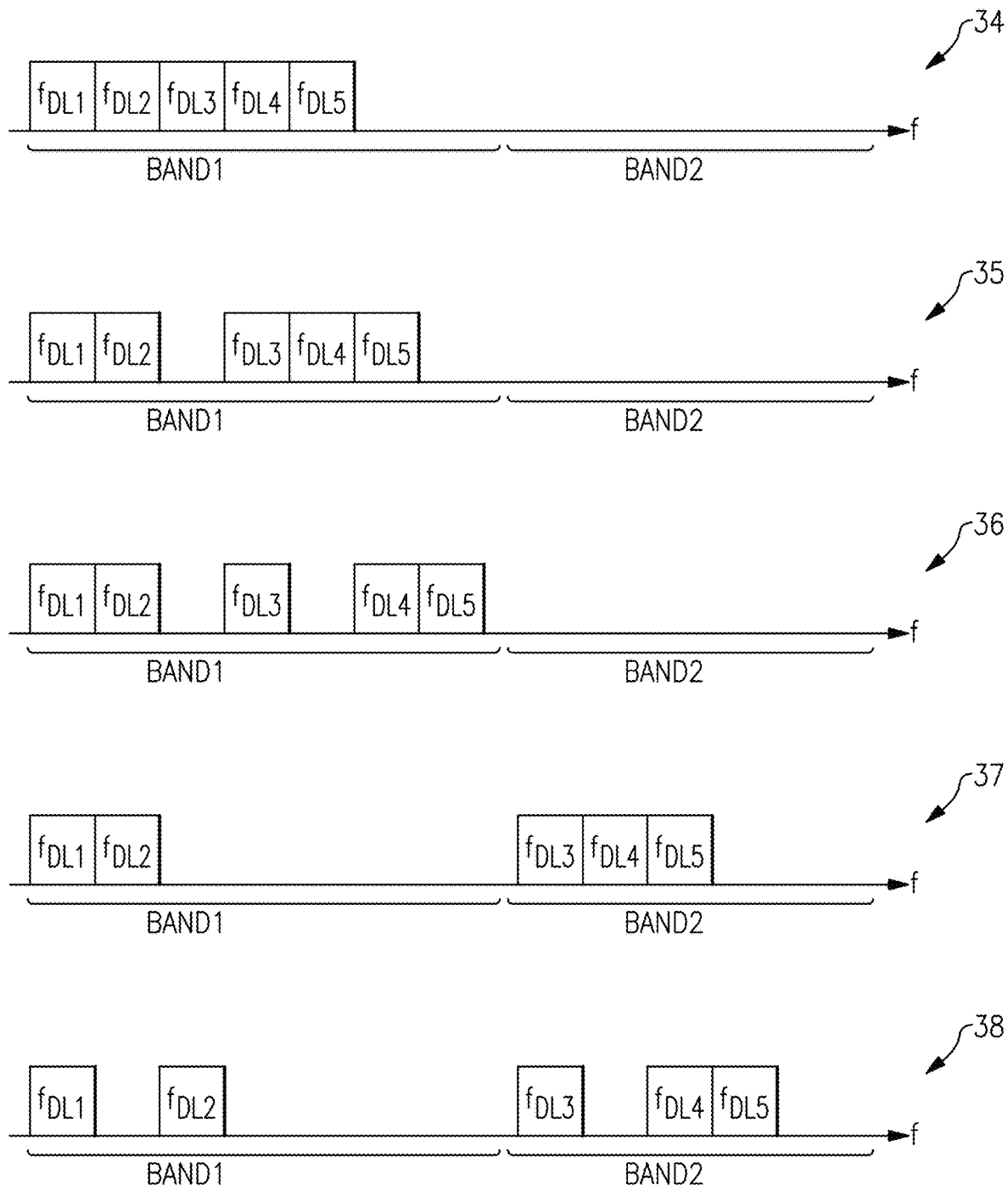
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
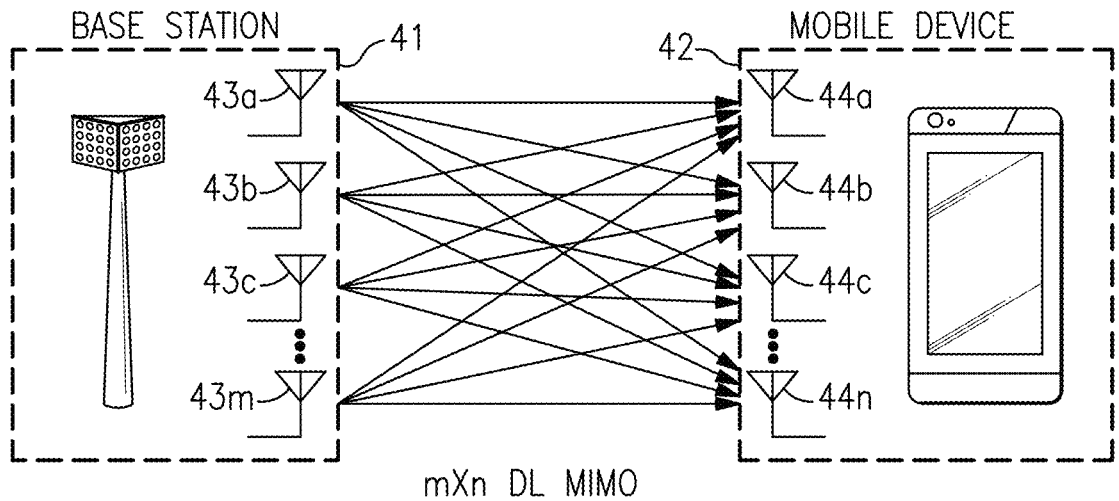
FIG. 3A is a schematic diagram of one example of a downlink channel using multi-input and multi-output (MIMO) communications.
Figure 3B:
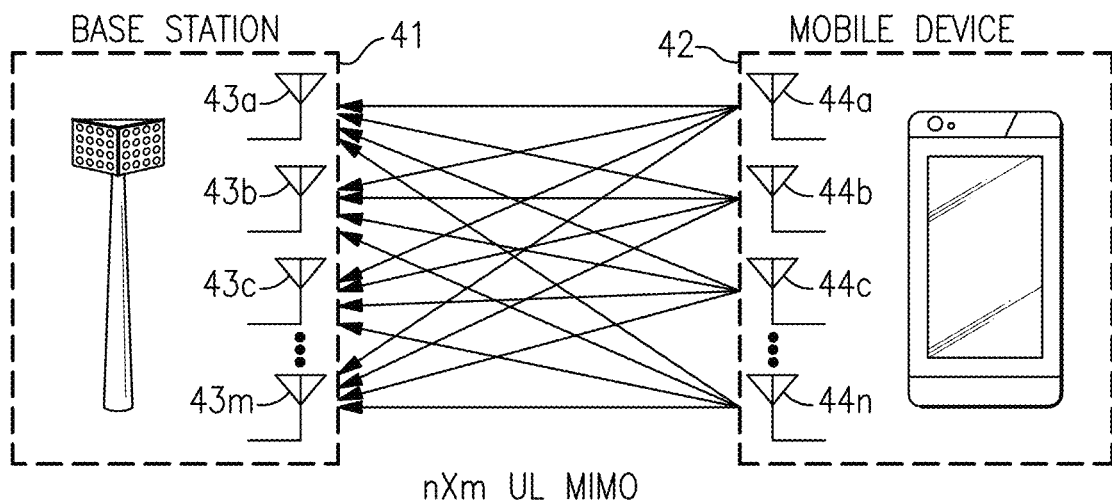
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, ... $43m$ of the base station $41$ and receiving using N antennas $44a$, $44b$, $44c$, ... $44n$ of the mobile device $42$. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, ... $44n$ of the mobile device $42$ and receiving using M antennas $43a$, $43b$, $43c$, ... $43m$ of the base station $41$. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
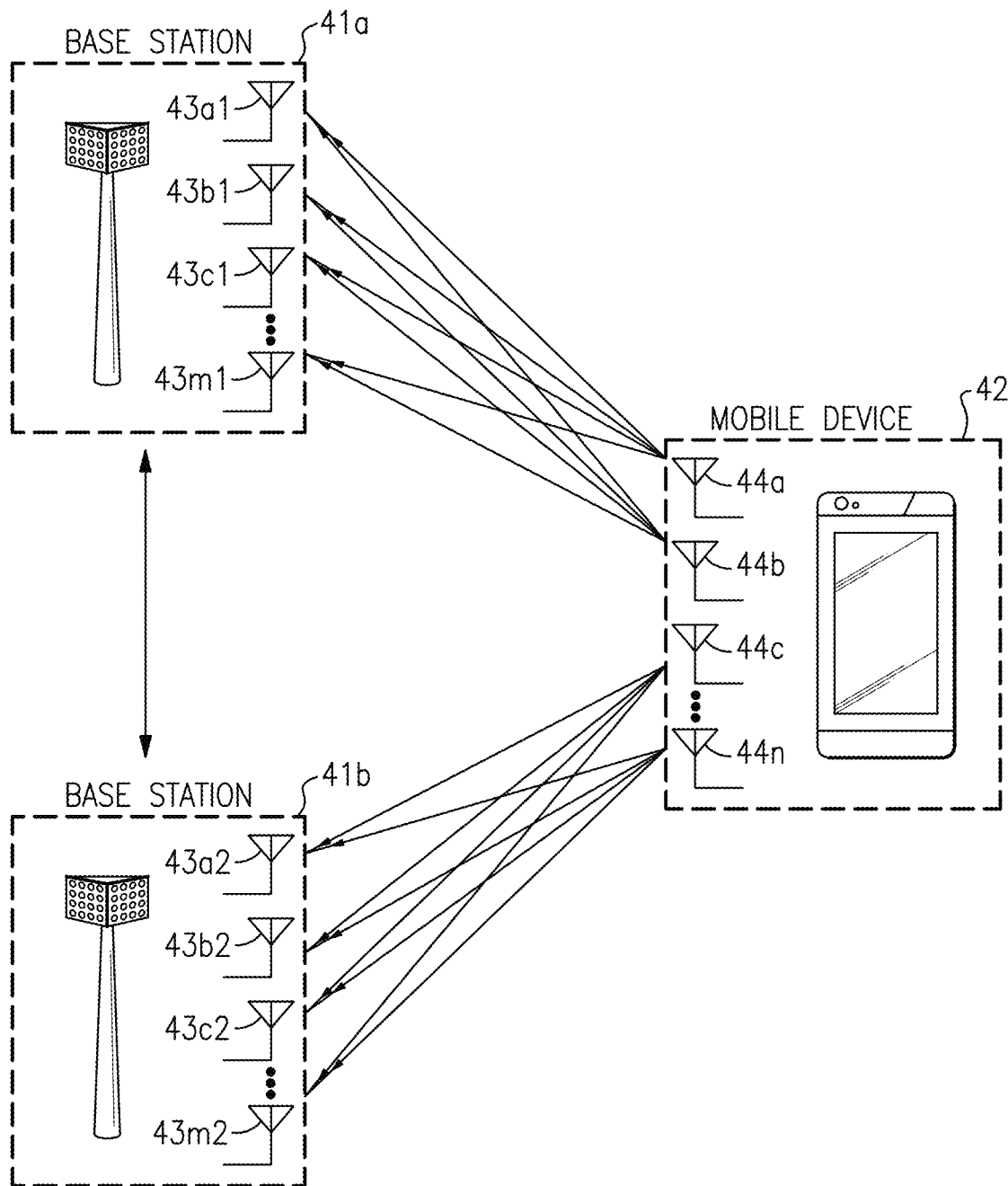
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, ... $44n$ of the mobile device $42$. Additional a first portion of the uplink transmissions are received using M antennas $43a1$, $43b1$, $43c1$, ... $43m1$ of a first base station $41a$, while a second portion of the uplink transmissions are received using M antennas $43a2$, $43b2$, $43c2$, ... $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4A:
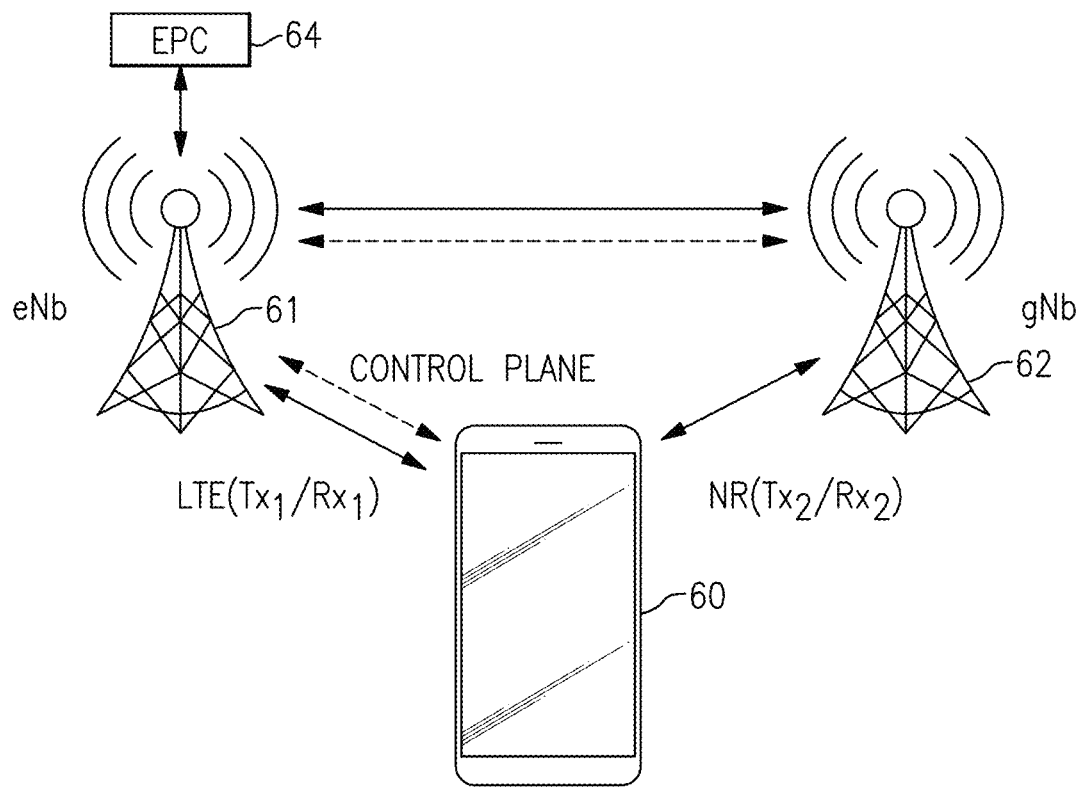
FIG. 4A is a schematic diagram of an example dual connectivity network topology.

FIG. 4A is a schematic diagram of an example dual connectivity network topology. The depicted architecture leverages LTE legacy coverage to ensure continuity of service delivery and the progressive rollout of 5G cells. A UE $60$ can simultaneously transmit dual uplink LTE and NR carrier. The UE $60$ can transmit an uplink LTE carrier Tx1 to the eNB $61$ while transmitting an uplink NR carrier Tx2 to the gNB $62$ to implement dual connectivity. Any suitable combination of uplink carriers Tx1, Tx2 and/or downlink carriers Rx1, Rx2 can be concurrently transmitted via wireless links in the example network topology of FIG. 4A.

With continuing reference to FIG. 4A, the eNB $61$ can provide a connection with a core network, such as an Evolved Packet Core (EPC) $64$. The gNB $62$ can communicate with the core network via the eNB $61$. Control plane data can be wireless communicated between the UE $60$ and eNB $61$. The eNB $61$ can also communicate control plane data with the gNB $62$. Control plane data can propagate along the paths of the dashed lines in FIG. 4A. The solid lines in FIG. 4A represent data plane paths.

In the example dual connectivity topology of FIG. 4A, any suitable combinations of standardized bands and radio access technologies (e.g., FDD, TDD, SUL, SDL) can be wirelessly transmitted and received. This can present technical challenges related to having multiple separate radios and bands functioning in the UE $60$. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

Figure 4B:
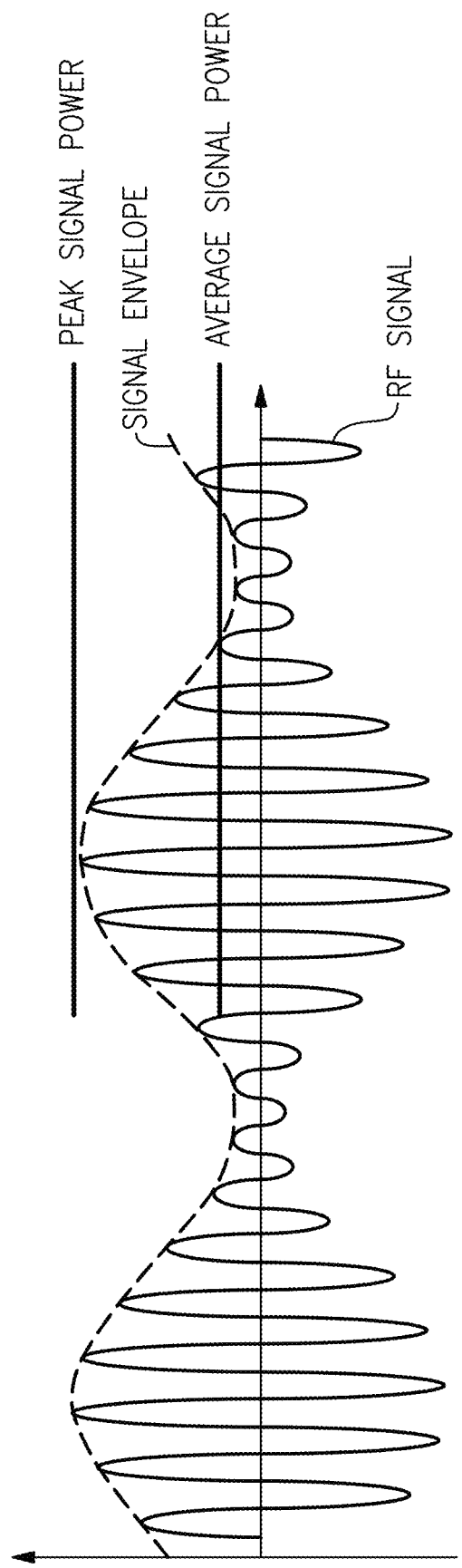
FIG. 4B is a graph illustrating one example of an RF signal waveform versus time.

FIG. 4B is a graph illustrating one example of an RF signal waveform versus time. The graph depicts the RF signal waveform, the envelope of the RF signal, the average signal power, and the peak signal power. The peak to average power ratio (PAPR) or crest factor of the RF signal waveform corresponds to the ratio of the waveform's peak signal power to the waveform's average signal power.

Figure 4C:
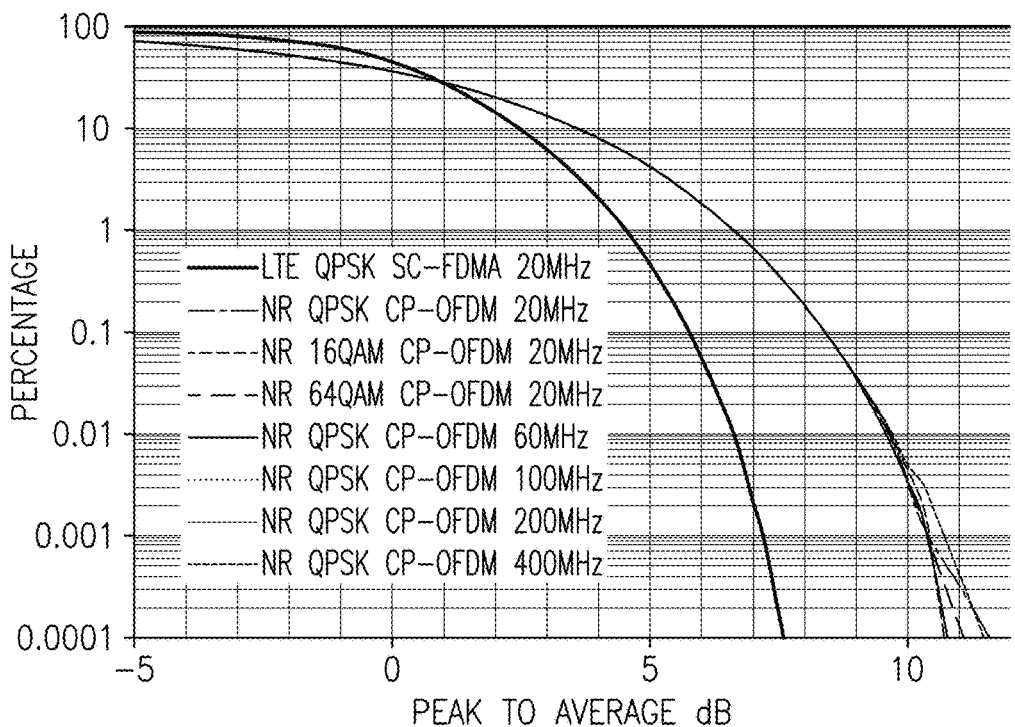
FIG. 4C is one example of a peak to average power ratio (PAPR) complementary cumulative distribution function (CCDF) for various cyclic prefix orthogonal frequency division multiplexing (CP-OFDM) waveforms relative to a single carrier frequency division multiple access (SC-FDMA) reference waveform.

FIG. 4C is one example of a PAPR complementary cumulative distribution function (CCDF) for various cyclic prefix orthogonal frequency division multiplexing (CP-OFDM) waveforms relative to a single carrier frequency division multiple access (SC-FDMA) reference waveform.

As shown in FIG. 4C, the PAPR CCDF is shown for a variety of modulation orders and bandwidths of CP-OFDM 5G NR waveforms. For the example waveforms shown, higher order modulations and wider signal bandwidth does not substantially increase PAPR, but rather the CP-OFDM waveforms have similar PAPR to one another.

When comparing 5G NR CP-OFDM waveforms to the reference LTE SC-FDMA QPSK waveform it can be seen that the 5G NR waveforms exhibit higher PAPR of about 3 dB or more. The higher PAPR raises a linearity constraint for a power amplifier. Moreover, for UE operating at a cell edge and/or with poor SNR, higher PAPR can constrain output power and/or increase battery current.

Figure 4D:
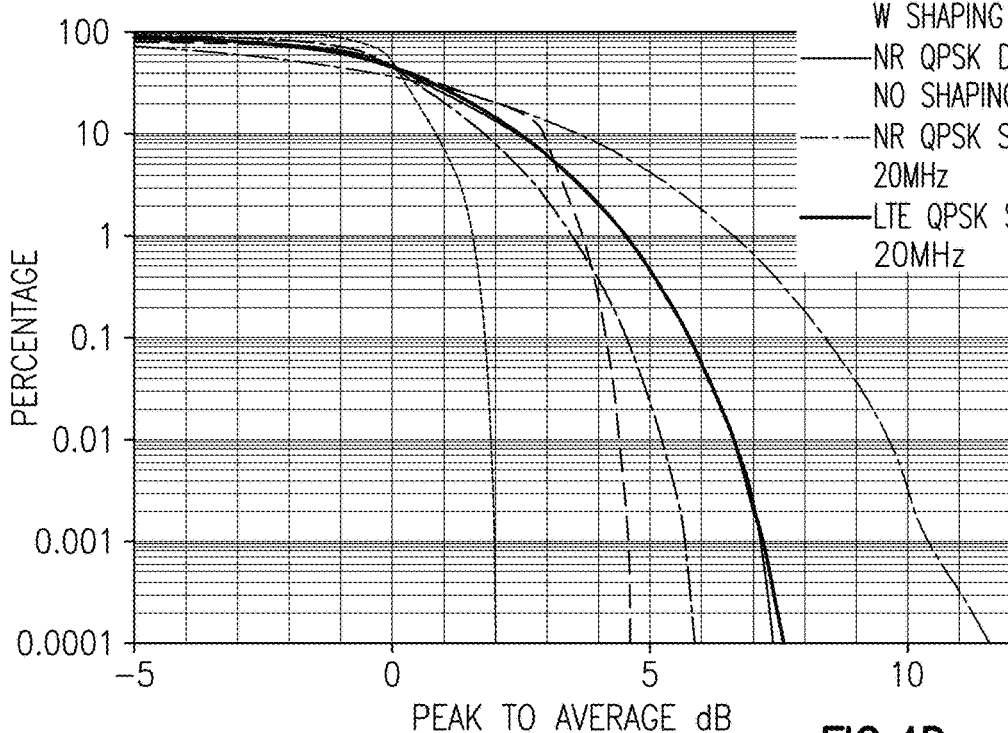
FIG. 4D is one example of a PAPR CCDF for various discrete Fourier transformation-spread-orthogonal frequency division multiplexing (DFT-s-OFDM) waveforms relative to a SC-FDMA reference waveform and a quadrature phase shift keying (QPSK) CP-OFDM 20 megahertz (MHz) waveform.

FIG. 4D is one example of a PAPR CCDF for various discrete Fourier transformation-spread-orthogonal frequency division multiplexing (DFT-s-OFDM) waveforms relative to a SC-FDMA reference waveform and a QPSK CP-OFDM 20 MHz waveform.

As shown in FIG. 4D, the PAPR CCDF is shown for a variety of modulation order and bandwidths of CP-OFDM 5G NR waveforms, with or without spectral shaping. The QPSK DFT-s-OFDM 20 MHz waveform without shaping has similar PAPR behavior as the reference LTE SC-FDMA QPSK waveform.

As shown by a comparison of FIGS. 4C and 4D, the DFT-s-OFDM waveforms of FIG. 4D operate with lower PAPR relative to the CP-OFDM waveforms of FIG. 4C. In certain implementations half pi (PI/2) binary phase shift keying (BPSK) and/or spectral shaping techniques can be used to reduce PAPR. For instance, for the examples shown, spectral shaping techniques selectively enable 2 dB PAPR improvement for QPSK and 5 dB improvement for PI/2 BPSK DFT-s-OFDM waveforms when compared to the reference LTE signal.

Examples of Average Power Tracking (APT) Systems with Fast Transient Settling

5G NR specifies a faster transition time for OFF-to-ON, ON-to-OFF, and changes in gain/mode of a transmit chain. Thus, pre-power amplifier switching, band selection switching, antenna selection switching, and gain settings in 5G NR operate with tighter timing relative to 4G LTE.

Such tighter timing arises from a reduction (for instance, about 50%) in allowed inter-slot timing relative to 4G LTE as well as shorter cyclic prefix (CP) of 5G NR associated with higher bandwidth sub-carrier spacing (SCS). For example, 4G LTE can have a fixed 15 kilohertz (kHz) SCS and a CP of 4.7 microseconds (μ), while 5G NR can have a varying SCS and CP profile. For instance, 5G NR can specify 15 kHz SCS for CP of 4.7 μs, but 30 kHz SCS for CP of 2.35 μs and 60 kHz SCS for CP of 1.17 μs.

The CP is the portion of the symbol that is assumed damaged by multi-path reflections, and thus is repeated at the tail end of the symbol transmission. Accordingly, any gain error due to transient impairments of the transmit chain should be limited within this timing for best error vector magnitude (EVM) and throughput performance. When a serial interface (for instance, a MIPI RF Front End Control Interface) for a front end system is programmed, how long it takes for the active transmit chain (as well as the receive chain) to react to achieve the desired change (for instance, gain step, mode change, and/or other parameters) becomes of rising importance for 5G NR due to tighter timing specifications.

One technique for managing efficiency of a power amplifier is average power tracking (APT), in which a DC-to-DC converter is used to generate a supply voltage for a power amplifier based on the power amplifier's average output power.

APT is especially challenging in 5G NR due to the rate at which the DC-to-DC voltage of the switching regulator supply power management unit (PMU) can be quite slow relative to what is desired. The additional delay of the DC-to-DC converter makes it difficult to meet the strict timing constraints of 5G NR uplink (UL) for user equipment (UE).

APT is used to generate a supply voltage for a power amplifier based on the power amplifier's average output power. For example, when providing APT, the supply voltage can be set to a particular voltage level over a time interval (for instance, set at a fixed voltage level over a transmit frame) based on the average output power over the time interval.

Figure 5A:
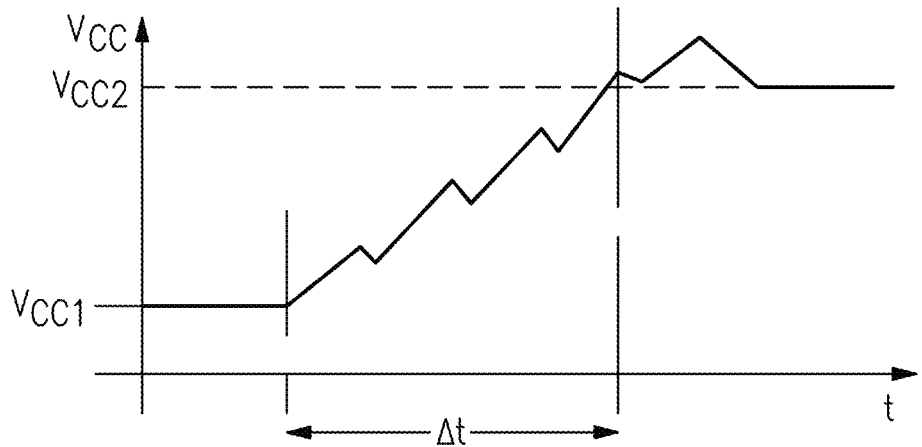
FIG. 5A is one example of a voltage versus time waveform for an average power tracking (APT) system.

FIG. 5A is one example of a voltage versus time waveform for an APT system using only an output of a DC-to-DC converter to control a power amplifier supply voltage $V_{CC}$ of a power amplifier.

In accordance with an APT power management scheme, the power amplifier supply voltage $V_{CC}$ changes from a first supply voltage level $V_{CC1}$ to a second supply voltage level $V_{CC2}$. Due to relatively slow regulation speed and output driving capability of the DC-to-DC converter, the APT system takes a relatively long time to transition from $V_{CC1}$ to $V_{CC2}$, and also suffers from undesired overshoot once $V_{CC2}$ is reached.

Provided herein are APT systems with fast transient settling. In certain embodiments, an APT system includes a DC-to-DC converter that is assisted by an error amplifier (also referred to herein as a linear amplifier) in transitioning from one power amplifier supply voltage level to another power amplifier supply voltage level. Thus, the combination of a DC-to-DC converter with a fast changing error amplifier can swing enough AC voltage with a low enough slew rate to be able to rapidly transition the power amplifier supply voltage from one APT voltage level to another APT voltage level.

Accordingly, the timing calibration of the normally critical amplitude and phase delay for APT is overcome, and the large transient swings of the transmit chain are limited in duration just during steps in gain/power/mode of the power amplifier. Moreover, the design constraints of the error amplifier are greatly simplified for noise, linearity, calibration, and many far reaching constraints of performance necessitating significant programming and complexity for stability when paired with the DC-to-DC converter. Accordingly, lower cost and/or smaller area implementation is enabled. The error amplifier can be integrated with a centralized (and shared amongst transmit modules) DC-DC converter, or equivalently integrated into each of those transmit modules in order to reduce parasitics, inductive and capacitive loading of each core power amplifier.

Figure 5B:
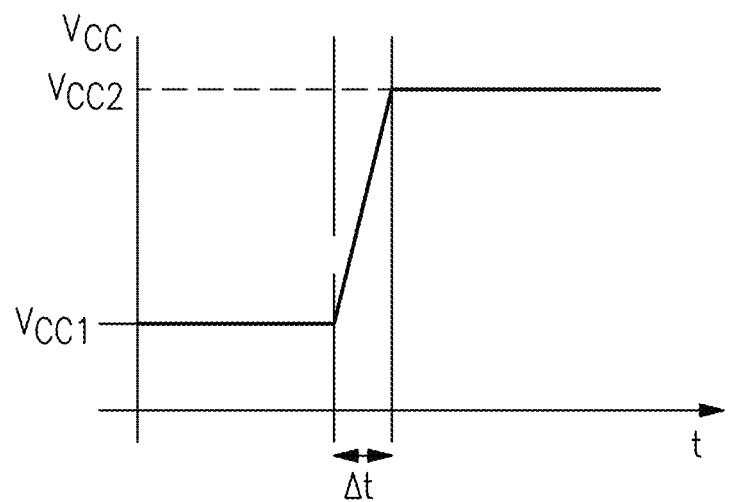
FIG. 5B is another example of a voltage versus time waveform for APT system.

FIG. 5B is another example of a voltage versus time waveform for an APT system in accordance with the teachings herein. In comparison the timing depicted in FIG. 5A, the timing depicted in FIG. 5B rapidly transitions from $V_{CC1}$ to $V_{CC2}$ with little to no overshoot.

Figure 6:
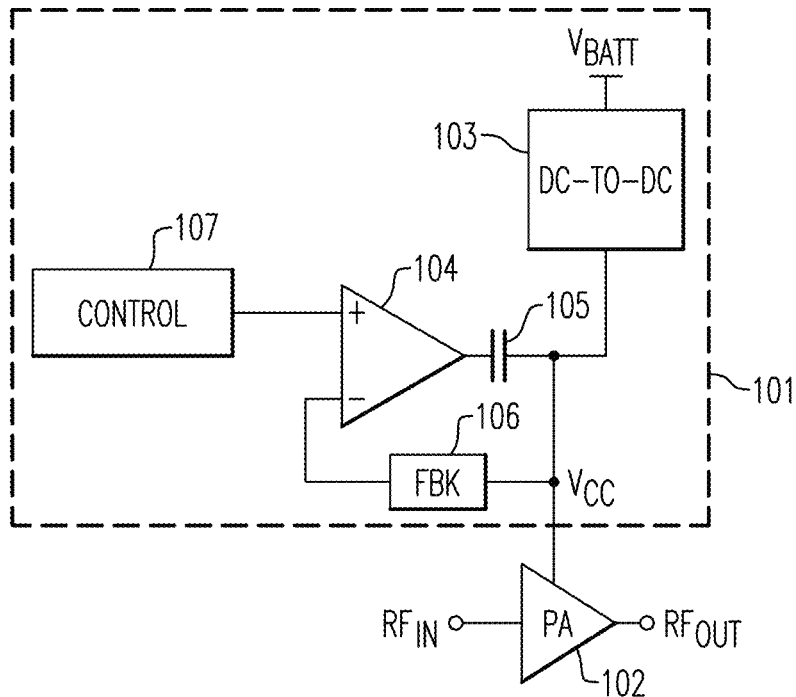
FIG. 6 is a schematic diagram of one embodiment of an APT system for a power amplifier.

FIG. 6 is a schematic diagram of one embodiment of an APT system 101 for a power amplifier 102. The power amplifier 102 amplifies an RF input signal $RF_{IN}$ to generate an output signal $RF_{OUT}$, and is powered by a power amplifier supply voltage from the APT system 101.

The APT system 101 includes a DC-to-DC converter 103, an error amplifier 104, an AC coupling capacitor 105, a feedback circuit 106, and a control circuit 107. The DC-to-DC converter 103 is powered by a battery voltage $V_{BATT}$, and includes an output coupled to the power amplifier supply voltage $V_{CC}$. The error amplifier 104 includes an output that provides a current by way of the AC coupling capacitor 105 to adjust the power amplifier supply voltage $V_{CC}$. A first input of the error amplifier 104 is controlled by the control circuit 107, while a second input of the error amplifier 104 is connected to the output of the error amplifier 104 by way of the feedback circuit 106.

The APT system 101 of FIG. 6 enables rapid transition in the high current capability DC-to-DC supply to step between at symbol-to-symbol, slot-to-slot and subframe-to-subframe transitions, and significantly reduces the timing of the transitions to achieve compliance with aggressively short 5G NR transient settling and/or enable OFF/ON timing steps.

Figure 7:
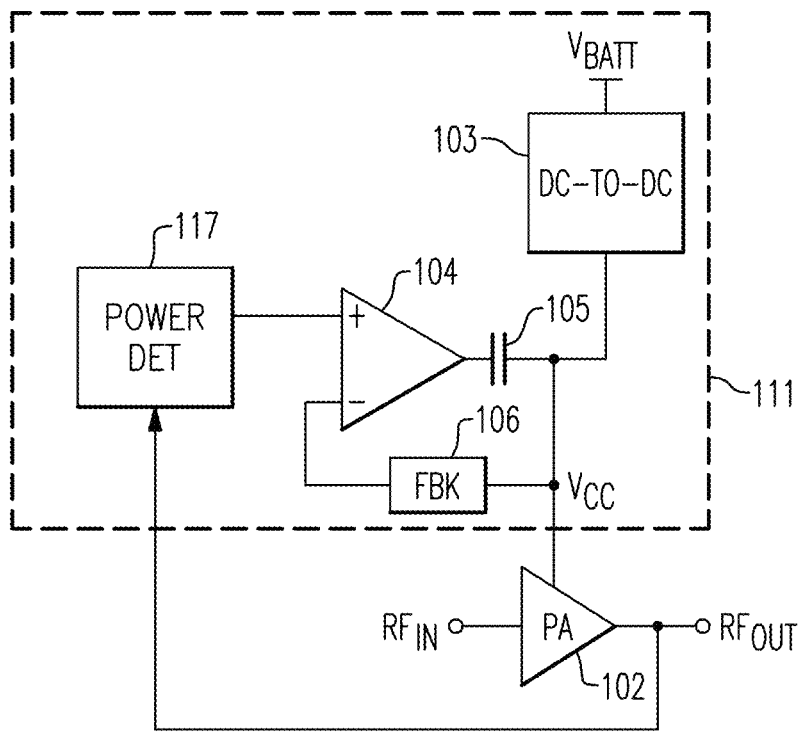
FIG. 7 is a schematic diagram of another embodiment of an APT system for a power amplifier.

FIG. 7 is a schematic diagram of another embodiment of an APT system 111 for a power amplifier 102. The APT system 111 includes a DC-to-DC converter 103, an error amplifier 104, an AC coupling capacitor 105, a feedback circuit 106, and a power detector 117.

The APT system 111 of FIG. 7 is similar to the APT system 101 of FIG. 6, except that the APT system 111 of FIG. 7 includes the power detector 117 for controlling the first input of the error amplifier 104 based on a detected output power of the power amplifier 102.

Figure 8:
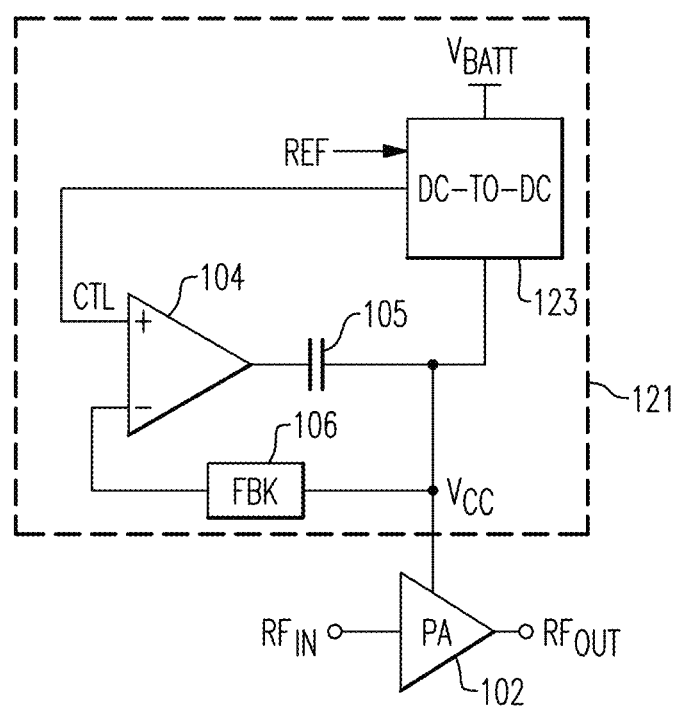
FIG. 8 is a schematic diagram of another embodiment of an APT system for a power amplifier.

FIG. 8 is a schematic diagram of another embodiment of an APT system 121 for a power amplifier 102. The APT system 121 includes a DC-to-DC converter 123, an error amplifier 104, an AC coupling capacitor 105, and a feedback circuit 106.

As shown in FIG. 8, the DC-to-DC converter 123 receives a reference signal REF that changes based on the desired APT voltage level for the power amplifier supply voltage $V_{CC}$, thereby aiding the DC-to-DC converter 123 is achieved regulation at an appropriate voltage level. The DC-to-DC converter 123 uses the reference signal REF at least in part to generate a control signal CTL for the first input of the error amplifier 104.

Figure 9A:
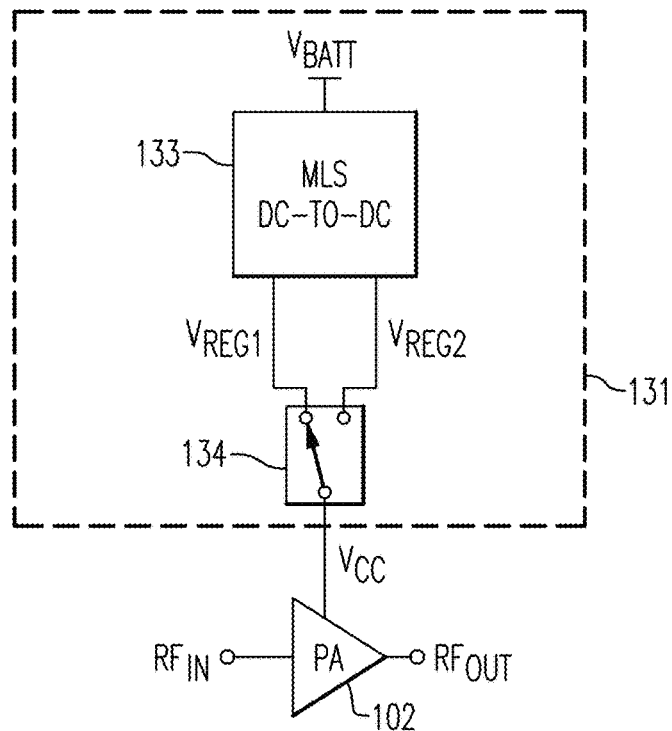
FIG. 9A is a schematic diagram of another embodiment of an APT system for a power amplifier.

FIG. 9A is a schematic diagram of another embodiment of an APT system 131 for a power amplifier 102. The APT system 131 includes a multi-level-supply (MLS) DC-to-DC converter 133 and a DC switch 134.

In the illustrated embodiment, the MLS DC-to-DC converter 133 is powered by a battery voltage $V_{BATT}$ and generates a first regulated voltage $V_{REG1}$ and a second regulated voltage $V_{REG2}$ each corresponding to a regulated voltage level for APT power tracking. For example, $V_{REG1}$ can be regulated to the first APT voltage level $V_{CC1}$, while $V_{REG2}$ can be regulated to the second APT voltage level $V_{CC2}$. The DC switch 134 outputs the power amplifier supply voltage $V_{CC}$ based on selecting amongst the regulated voltages. Although an embodiment with an MLS DC-to-DC converter is depicted, separate DC-to-DC regulators can be used to generate the first regulated voltage $V_{REG1}$ and the second regulated voltage $V_{REG2}$.

Figure 9B:
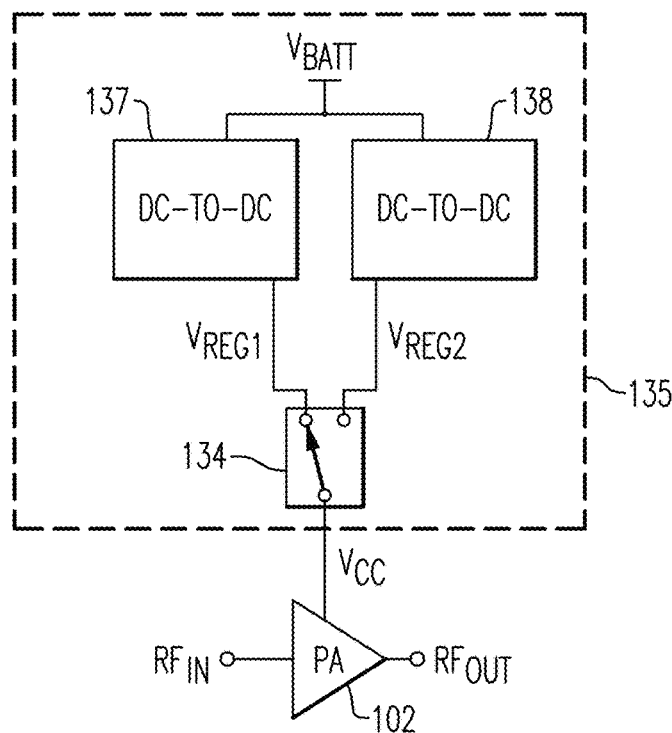
FIG. 9B is a schematic diagram of another embodiment of an APT system for a power amplifier.

FIG. 9B is a schematic diagram of another embodiment of an APT system 135 for a power amplifier 102. The APT system 135 includes a DC switch 134, a first DC-to-DC converter 137, and a second DC-to-DC converter 138.

The first DC-to-DC converter 137 is powered by a battery voltage $V_{BATT}$ and generates a first regulated voltage $V_{REG1}$. Additionally, the second DC-to-DC converter 138 is powered by the battery voltage $V_{BATT}$ and generates a second regulated voltage $V_{REG2}$. The first regulated voltage $V_{REG1}$ and the second regulated voltage $V_{REG2}$ each correspond to a regulated voltage level for APT power tracking. For example, $V_{REG1}$ can be regulated to the first APT voltage level $V_{CC1}$, while $V_{REG2}$ can be regulated to the second APT voltage level $V_{CC2}$. The DC switch 134 outputs the power amplifier supply voltage $V_{CC}$ based on selecting amongst the regulated voltages.

Figure 10:
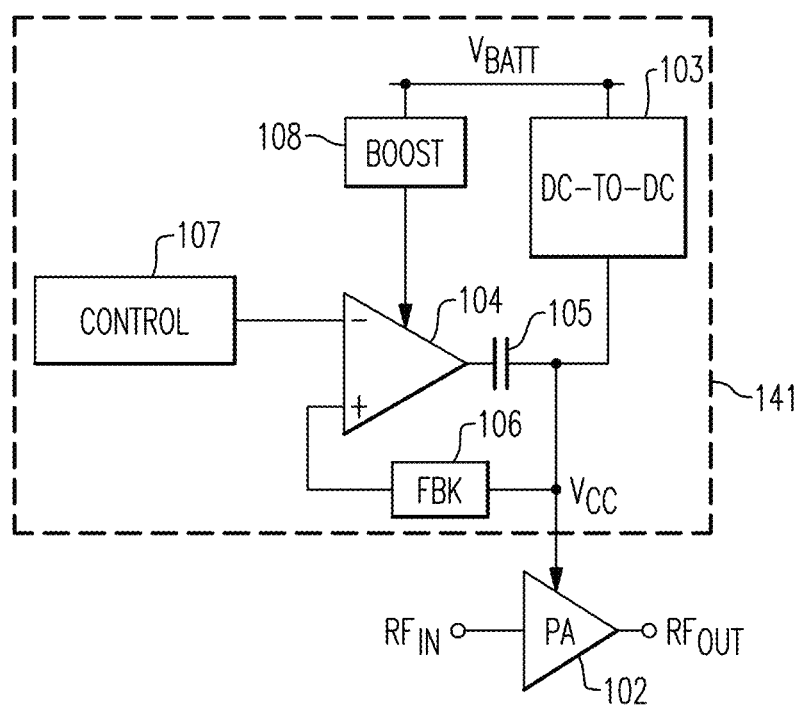
FIG. 10 is a schematic diagram of another embodiment of an APT system for a power amplifier.

FIG. 10 is a schematic diagram of another embodiment of an APT system 141 for a power amplifier 102. The APT system 141 includes a DC-to-DC converter 103, an error amplifier 104, an AC coupling capacitor 105, a feedback circuit 106, a control circuit 107, and a boost regulator 108.

The APT system 141 of FIG. 10 is similar to the APT system 101 of FIG. 6, except that the APT system 141 further includes the boost regulator 108 for generating a boosted regulated voltage from the battery voltage $V_{BATT}$. The boosted regulated voltage is used to power the error amplifier 104.

Figure 11:
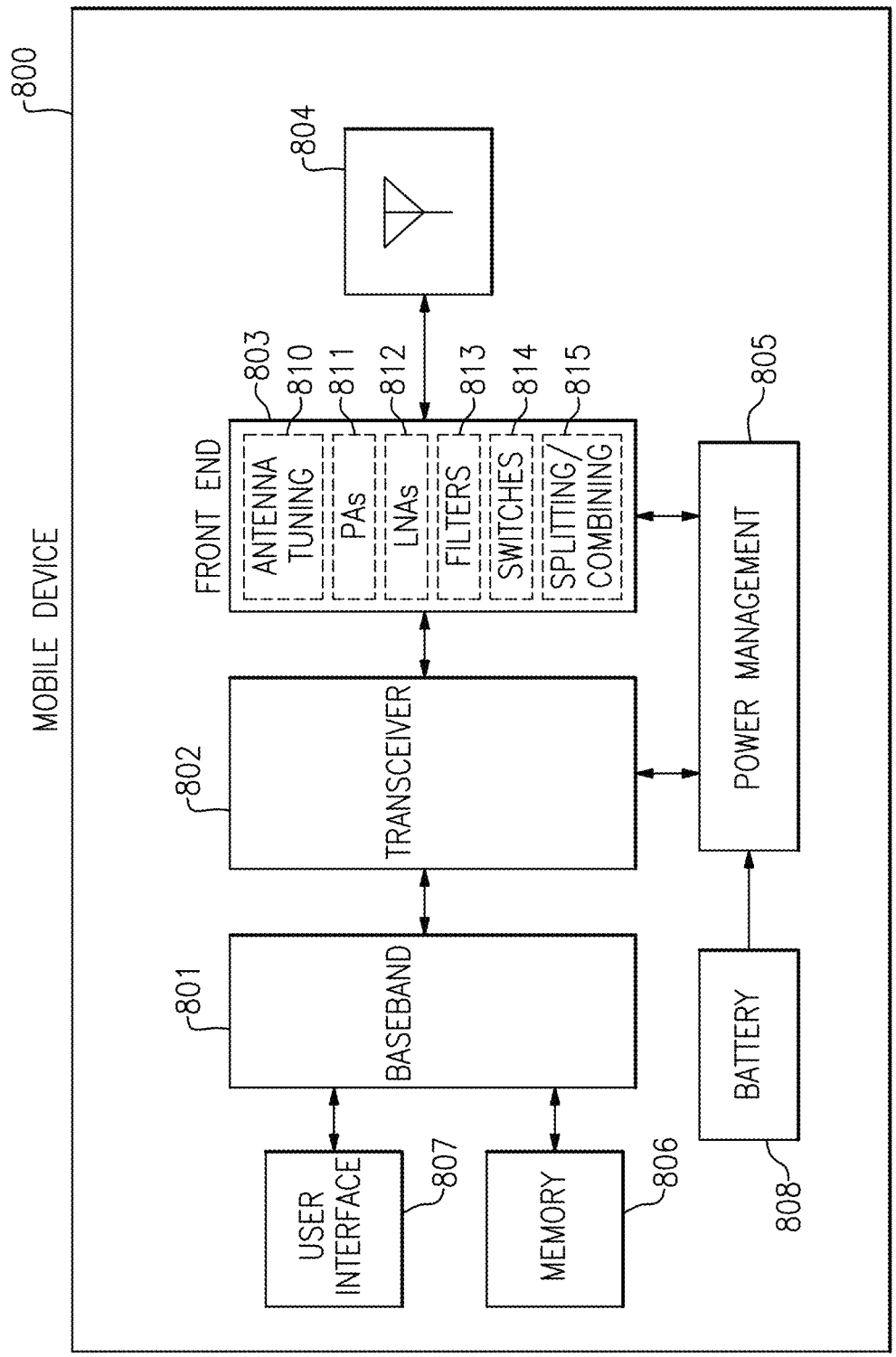
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE). The power management system 805 can include PMUs implemented in accordance with the teachings herein. Thus, the power management system 805 can be implemented in accordance with any of the embodiments herein, and serves as a power management sub-system for UE.

As shown in FIG. 11, the power management system 805 receives a battery voltage from the battery 808. The battery 808 can be any suitable battery for use in the mobile device 800, including, for example, a lithium-ion battery.

Figure 12:
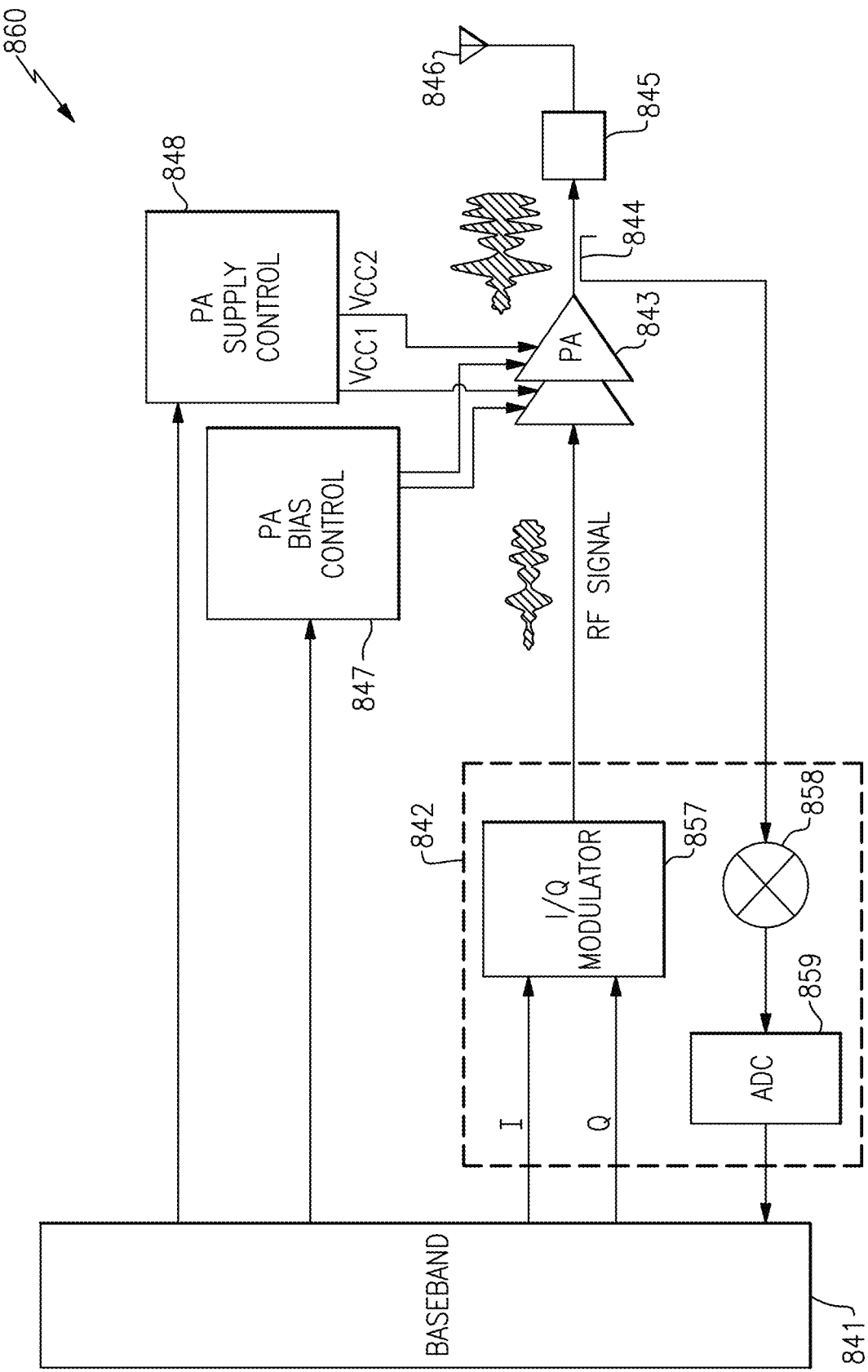
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 13:
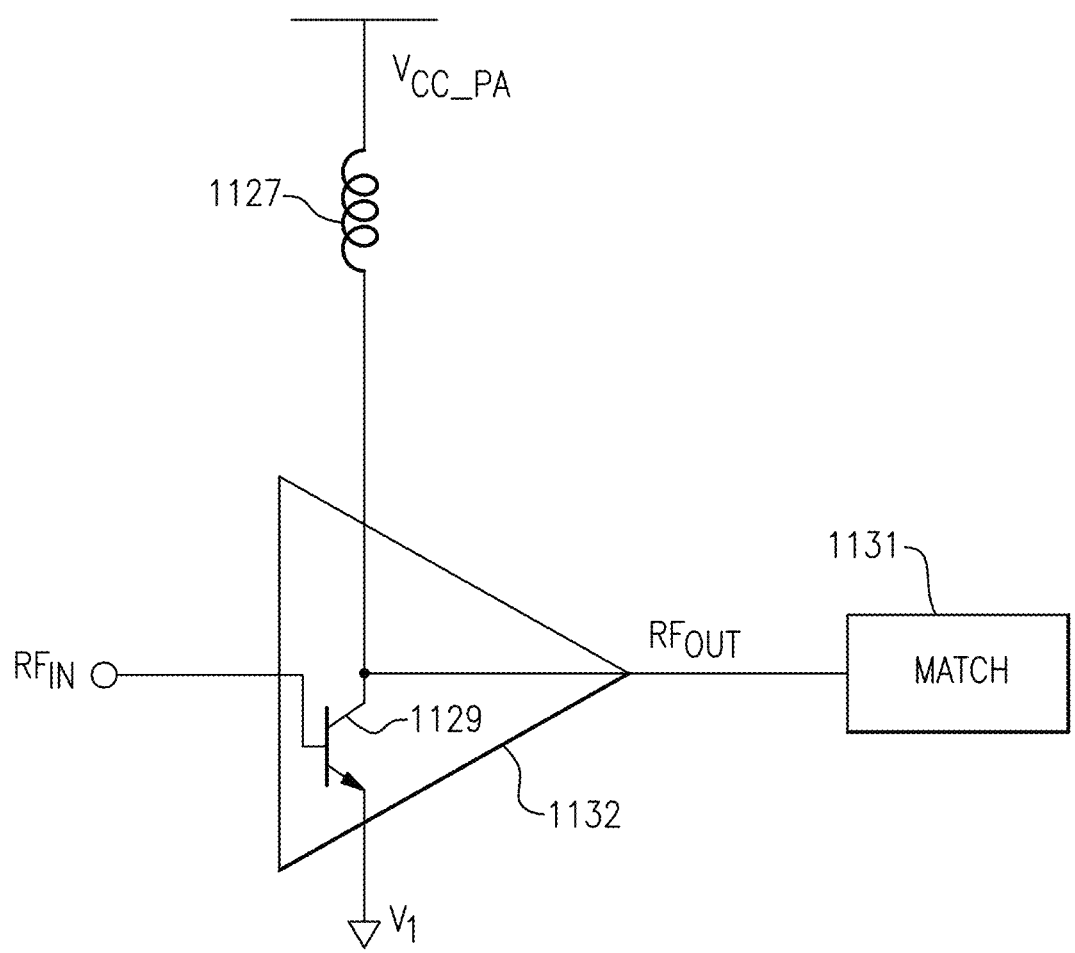
FIG. 13 is a schematic diagram of one example of a power amplifier powered by a power amplifier supply voltage.

FIG. 13 is a schematic diagram of one example of a power amplifier 1132 powered by a power amplifier supply voltage $V_{CC\_PA}$. As shown in FIG. 13, an inductor 1127 is used to provide the power amplifier supply voltage $V_{CC\_PA}$ from a PMU to the power amplifier 1132, which is terminated using an output impedance matching circuit 1131.

The illustrated power amplifier 1132 includes a bipolar transistor 1129 having an emitter, a base, and a collector. As shown in FIG. 13, the emitter of the bipolar transistor 1129 is electrically connected to a power low supply voltage $V_1$, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 13 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 14:
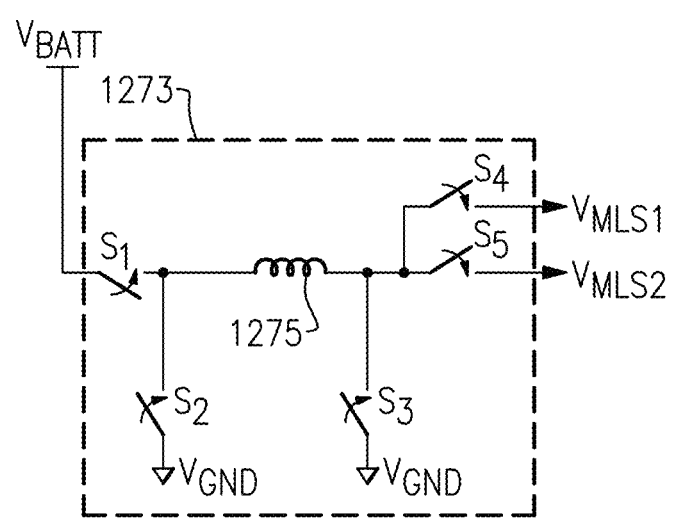
FIG. 14 is a schematic diagram of a multi-level-supply (MLS) DC-to-DC converter according to one embodiment.

FIG. 14 is a schematic diagram of an MLS DC-to-DC converter 1273 according to one embodiment. The MLS DC-to-DC converter 1273 includes an inductor 1275, a first switch $S_1$, a second switch $S_2$, a third switch $S_3$, a fourth switch $S_4$, and a fifth switch $S_5$. The MLS DC-to-DC converter 1273 further includes control circuitry (not shown in FIG. 14) for opening and closing the switches to provide regulation.

The MLS DC-to-DC converter 1273 of FIG. 14 illustrates one implementation of an MLS DC-to-DC converter suitable for incorporation in the APT system 131 of FIG. 9A. However, other implementations of MLS DC-to-DC converters can be used.

In the illustrated embodiment, the first switch $S_1$ includes a first end electrically connected to a battery voltage $V_{BATT}$ and a second end electrically connected to a first end of the second switch $S_2$ and to a first end of the inductor 1275. The second switch $S_2$ further includes a second end electrically connected to a first or ground supply $V_{GND}$. Although FIG. 14 illustrates a configuration of a DC-to-DC converter that is powered using a ground supply and a battery voltage, the teachings herein are applicable to DC-to-DC converters powered using any suitable power supplies. The inductor 1275 further includes a second end electrically connected to a first end of each of the third to fifth switches $S_3$-$S_5$. The third switch $S_3$ further includes a second end electrically connected to the ground supply $V_{GND}$. The fourth switch $S_4$ and the fifth switch $S_5$ each include a second end configured to generate the first regulated voltage $V_{MLS1}$ and the second regulated voltage $V_{MLS2}$, respectively.

The first to fifth switches $S_1$-$S_5$ are selectively opened or closed to maintain regulated voltages within a particular error tolerance of target voltage levels.

In the illustrated embodiment, the MLS DC-to-DC converter 1273 operates as a buck-boost converter operable to generate regulated boost voltages greater than the battery voltage $V_{BATT}$ and/or regulated buck voltages lower than the battery voltage $V_{BATT}$. However, other implementations are possible.

Applications

Some of the embodiments described above have provided examples in connection with mobile devices. However, the principles and advantages of the embodiments can be used for any other systems or apparatus that have needs for power amplifiers. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency signal;
a front-end system including a power amplifier configured to amplify the radio frequency signal, the power amplifier configured to receive power from a power amplifier supply voltage; and
a power management system configured to provide the power amplifier supply voltage to the power amplifier, the power management system including an AC coupling capacitor, a feedback circuit, a DC-to-DC converter having an output configured to regulate the power amplifier supply voltage, and an error amplifier configured to operate in combination with one another to transition the power amplifier supply voltage from a first average power tracking voltage level to a second average power tracking voltage level, the error amplifier having a first input controlled based on the second average power tracking voltage level, a second input, and an output configured to provide a current to the output of the DC-to-DC converter by way of the AC coupling capacitor, the AC coupling capacitor and the feedback circuit electrically connected in series between output of the error amplifier and the second input of the error amplifier, a portion of the current providing feedback from the output of the error amplifier to the second input by way of the AC coupling capacitor and the feedback circuit.

2. The mobile device of claim 1 wherein the power management system further includes a control circuit configured to control the first input of the error amplifier based on the second average power tracking voltage level.

3. The mobile device of claim 2 wherein the control circuit includes a power detector configured to control the first input of the error amplifier based on sensing an output power of the power amplifier.

4. The mobile device of claim 1 wherein the DC-to-DC converter receives a reference voltage indicating the second average power tracking voltage level.

5. The mobile device of claim 4 wherein the DC-to-DC converter is configured to output a control voltage for controlling the first input of the error amplifier.

6. The mobile device of claim 1 further comprising a battery configured to provide a battery voltage to the DC-to-DC converter.

7. The mobile device of claim 6 wherein the power management system further includes a boost regulator configured to generate a boosted supply voltage for the error amplifier from the battery voltage.

8. The mobile device of claim 1 further comprising an antenna configured to transmit an amplified radio frequency signal provided from the power amplifier.

9. A method of average power tracking in a mobile device, the method comprising:
amplifying a radio frequency signal using a power amplifier;
powering the power amplifier using a power amplifier supply voltage provided by a power management system that includes an AC coupling capacitor, a feedback circuit, an error amplifier and a DC-to-DC converter, the error amplifier having a first input, and second input, and an output, and the AC coupling capacitor and the feedback circuit electrically connected in series between output of the error amplifier and the second input of the error amplifier;
transitioning the power amplifier supply voltage from a first average power tracking voltage level to a second average power tracking voltage level using the error amplifier and the DC-to-DC converter of the power management system, the DC-to-DC converter having an output regulating the power amplifier supply voltage, the first input of the error amplifier controlled based on the second average power tracking voltage level;
providing a current from an output of the error amplifier to the output of the DC-to-DC converter by way of the AC coupling capacitor of the power management system; and
using a portion of the current to provide feedback from the output of the error amplifier to the second input by way of the AC coupling capacitor and the feedback circuit.

10. The method of claim 9 wherein transitioning the power amplifier supply voltage further includes controlling the first input of the error amplifier based on the second average power tracking voltage level.

11. The method of claim 10 further comprising controlling the first input of the error amplifier based on sensing an output power of the power amplifier.

12. The method of claim 9 wherein transitioning the power amplifier supply voltage further includes providing a reference voltage indicating the second average power tracking voltage level to the DC-to-DC converter.

13. The method of claim 12 wherein transitioning the power amplifier supply voltage further includes outputting a control voltage from the DC-to-DC converter, and controlling the first input of the error amplifier using the control voltage.

14. A power amplifier system comprising:
a power amplifier configured to amplify a radio frequency signal, the power amplifier configured to receive power from a power amplifier supply voltage;
a DC-to-DC converter having an output configured to regulate the power amplifier supply voltage;
a feedback circuit;
an AC coupling capacitor; and
an error amplifier configured to operate in combination with the DC-to-DC converter to transition the power amplifier supply voltage from a first average power tracking voltage level to a second average power tracking voltage level, the error amplifier having a first input controlled based on the second average power tracking voltage level, a second input, and an output configured to provide a current to the output of the DC-to-DC converter by way of the AC coupling capacitor, the AC coupling capacitor and the feedback circuit electrically connected in series between output of the error amplifier and the second input of the error amplifier, a portion of the current providing feedback from the output of the error amplifier to the second input by way of the AC coupling capacitor and the feedback circuit.

15. The power amplifier system of claim 14 further comprising a control circuit configured to control the first input of the error amplifier based on the second average power tracking voltage level.

16. The power amplifier system of claim 15 wherein the control circuit includes a power detector configured to control the first input of the error amplifier based on sensing an output power of the power amplifier.

17. The power amplifier system of claim 14 wherein the DC-to-DC converter receives a reference voltage indicating the second average power tracking voltage level.

18. The mobile device of claim 1 wherein a first terminal of the AC coupling capacitor is directly connected to the output of the error amplifier, a second terminal of the AC coupling capacitor is directly connected to a first terminal of the feedback circuit, and a second terminal of the feedback circuit is directly connected to the second input of the error amplifier.

19. Method of claim 10 wherein a first terminal of the AC coupling capacitor is directly connected to the output of the error amplifier, a second terminal of the AC coupling capacitor is directly connected to a first terminal of the feedback circuit, and a second terminal of the feedback circuit is directly connected to the second input of the error amplifier.

20. The power amplifier system of claim 14 wherein a first terminal of the AC coupling capacitor is directly connected to the output of the error amplifier, a second terminal of the AC coupling capacitor is directly connected to a first terminal of the feedback circuit, and a second terminal of the feedback circuit is directly connected to the second input of the error amplifier.

* * * * *